(12) United States Patent
Almendarez

(10) Patent No.: US 11,639,960 B2
(45) Date of Patent: May 2, 2023

(54) INTEGRATED CIRCUIT SPIKE CHECK APPARATUS AND METHOD

(71) Applicant: Texas Instruments Incorporated, Dallas, TX (US)

(72) Inventor: Robert Gabriel Almendarez, Carrollton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 135 days.

(21) Appl. No.: 16/814,357

(22) Filed: Mar. 10, 2020

(65) Prior Publication Data

US 2021/0286003 A1  Sep. 16, 2021

(51) Int. Cl.
*G01R 31/317* (2006.01)
*G01R 31/28* (2006.01)
*G01R 31/319* (2006.01)

(52) U.S. Cl.
CPC ... *G01R 31/31718* (2013.01); *G01R 31/2896* (2013.01)

(58) Field of Classification Search
CPC .......... G01R 31/31718; G01R 31/2896; G01R 31/2889; G01R 31/31908; G01R 31/287
See application file for complete search history.

(56) References Cited

U.S. PATENT DOCUMENTS

| | | | | |
|---|---|---|---|---|
| 2011/0234249 | A1* | 9/2011 | Uematsu | G01R 31/2889 324/754.18 |
| 2012/0201006 | A1* | 8/2012 | Markovich | H01L 23/5389 29/830 |
| 2018/0180668 | A1* | 6/2018 | Ong | G01R 31/2896 |
| 2020/0033403 | A1* | 1/2020 | Bush | G01R 31/2886 |

* cited by examiner

*Primary Examiner* — Manuel L Barbee
(74) *Attorney, Agent, or Firm* — Yudong Kim; Frank D. Cimino

(57) ABSTRACT

Apparatus for testing an integrated circuit is described, including a set of signal conductors for communicating signals to respective external conductors of the integrated circuit. The apparatus also includes a tester comprising circuitry for outputting a signal. An interposer is electrically coupled between the set of signal conductors and the tester. The interposer comprises circuitry for selecting a set of signals between the set of signal conductors and the tester and outputting the set of signals. A signal processing apparatus is coupled to receive the set of signals, and the signal processing apparatus is operable to evaluate a parameter associated with each signal in the set of signals.

23 Claims, 2 Drawing Sheets

INTEGRATED CIRCUIT SPIKE CHECK APPARATUS AND METHOD

CROSS-REFERENCE TO RELATED APPLICATION

Not applicable.

BACKGROUND

The example embodiments relate to post-silicon integrated circuit (IC) spike testing and, more particularly, to apparatus and methods for improving such testing.

Various stages of pre-silicon IC design verification and post-silicon IC device testing have evolved, particularly as IC design and manufacturing have become more complex. IC complexities include, for example, circuit design size, layouts, and manufacturing process intricacies. Ultimately, when an IC design is finalized and the corresponding IC units from the design are produced in large quantities, often some or all of the individual ICs are tested, using computerized, and computer-controlled, automated test equipment (ATE).

In an electrical interfacing context, the ATE couples through various physical testing apparatus to interface with an IC. During such testing, the IC is sometimes referred to as a device under test (DUT). When the IC is still in wafer form, the wafer includes a number of IC regions. Nominally, each such IC region presents a same IC design, typically separated from other IC regions by scribe lines or some other delineation as between separate IC regions on the wafer. In this form, the ATE couples with an electromechanical device known as a prober, and the prober includes a set of pins for contacting respective pads on one wafer-located IC at a time. The prober further includes apparatus, sometimes referred to as a wafer chuck, for sequentially moving the wafer, and hence its IC regions, so that over time each IC region is positioned to contact the prober pin set. Alternatively, when the IC is in assembled form, typically after wafer singulation and IC packaging, the IC may be positioned in a test board socket, sometimes referred to as a contactor. The ATE interfaces with the test board, either directly or through intermediate connections and subassembly boards, to provide signals to the IC as a DUT. Further, the contactor has needles for contacting respective pins on the packaged IC, so each of the needles provides a test point to a respective IC pin and that may be probed as the ATE provides test signals to the IC.

In a programmatic signaling context, when an IC is interfaced to an ATE, the ATE executes test program instructions, causing signal stimulation to the IC and so that the IC response to the stimulation may be observed and/or stored. Specifically, the test program provides a sequence of IC test signals to the prober or test board, using ATE-provided resources such as digital, analog, timing, high-power, high precision, and the like. The ATE also may apply or control other DUT-specific testing resources located on the test board (or its subassemblies). Given that ATE testing is common to some or all ICs before releasing the devices for sale, the ATE testing sequences are themselves also tested, so as to ensure that such testing does not cause damage to ICs, either during the test or rendering the IC vulnerable to post-testing failure, which could occur after the IC is released for use. Such testing of the ATE testing sequences is sometimes referred to as spike testing. Spike testing in general may refer to testing a system using extreme values of input, typically in short periods. In the example embodiments context, however, ATE test program spike testing stimulates the DUT, while signals related to the test, such as to the DUT, from the DUT, or along electrical nodes/paths in the testing assembles are probed and evaluated throughout the test program execution. The evaluation is to ensure that the test-related signals do not exceed certain maxima that, from later large-scale use of the ATE test, could damage ICs being tested. The maxima used as limits during spike testing are typically values defined by the IC datasheet or specification. During spike testing, therefore, the ATE test program sequences through its corresponding instructions and signals are monitored, for example by probing DUT pins or a circuit board interface to the DUT, and the signal amplitude is compared against a corresponding limit to ensure the value does not spike beyond the limit In this manner, the goal is to observe, identify, and make record of any limit-exceeding signals, after which the ATE test program is modified to eliminate any test instruction(s) that caused the detected spikes. Accordingly, the ultimate goal of spike testing is producing a final ATE test program that is spike free. That final test is thereafter available for use with larger scale final test of ICs, which occurs prior to the final shipment/sale any IC that does passes testing by the final ATE test program.

Spike testing according to current and prior approaches is exceptionally tedious, for example since the testing typically involves handheld scope probes. During a spike test, these handheld probes are positioned, and repositioned, to various test board locations. In some instances, a probe is positioned to contact the above-introduced contactor, so as to interface with a corresponding DUT pin. In other instances, the probe is attached temporarily to a test point, for example using one or more alligator clips. Further, all DUT pins must be tested through a complete ATE program run, so for higher pin count devices this testing can take days of lab test time to complete. Hence, contemporary ATE test program spike checking can be laborious, time-consuming, subjective, and prone to human error. Further, the probe is also connected to an oscilloscope, so that while the test program runs, and the probe-to-test point contact is maintained, the test engineer also is tasked to observe the oscilloscope screen to watch the signal over the full duration of the test, requiring the engineer's presence during the entire test. The oscilloscope output must be watched to ensure that the signal at the test point does not exceed (spike beyond) the IC specifications, again during the entire duration of the ATE test sequence. Often an engineer will set the oscilloscope time sweep (time/div) slow enough so that the signal sweep observed over the entire duration of the test can fit within the oscilloscope screen. However, in doing so, any spikes that are sufficiently fast (e.g., microseconds or nanoseconds) will not be perceptible to the human eye due to the oscilloscope time setting, so the engineer may fail to identify such spikes, thereby defeating the purpose of the spike test. Additionally, this testing is often incomplete. Although some test entities only require DUT pins to be tested, voltage spikes can also occur on tester resources, for example caused by relay hot switching and live node connects. These conditions often go unnoticed and uncorrected into production, thereby potentially damaging tester resources through repeated spike exposure and resulting in costly tester board repair and down time.

Accordingly, example embodiments are provided in this document that may improve on certain of the above concepts, as further detailed below.

SUMMARY

An apparatus for testing an integrated circuit is described, including a set of signal conductors for communicating signals to respective external conductors of the integrated circuit. The apparatus also includes a tester comprising circuitry for outputting a test signal. An interposer is electrically coupled between the set of signal conductors and the tester. The interposer comprises circuitry for selecting a set of signals between the set of signal conductors and the tester and outputting the set of signals. A signal processing apparatus is coupled to receive the set of signals, and the signal processing apparatus is operable to evaluate a parameter associated with each signal in the set of signals.

Other aspects are also disclosed and claimed.

DETAILED DESCRIPTION

Figure 1A:
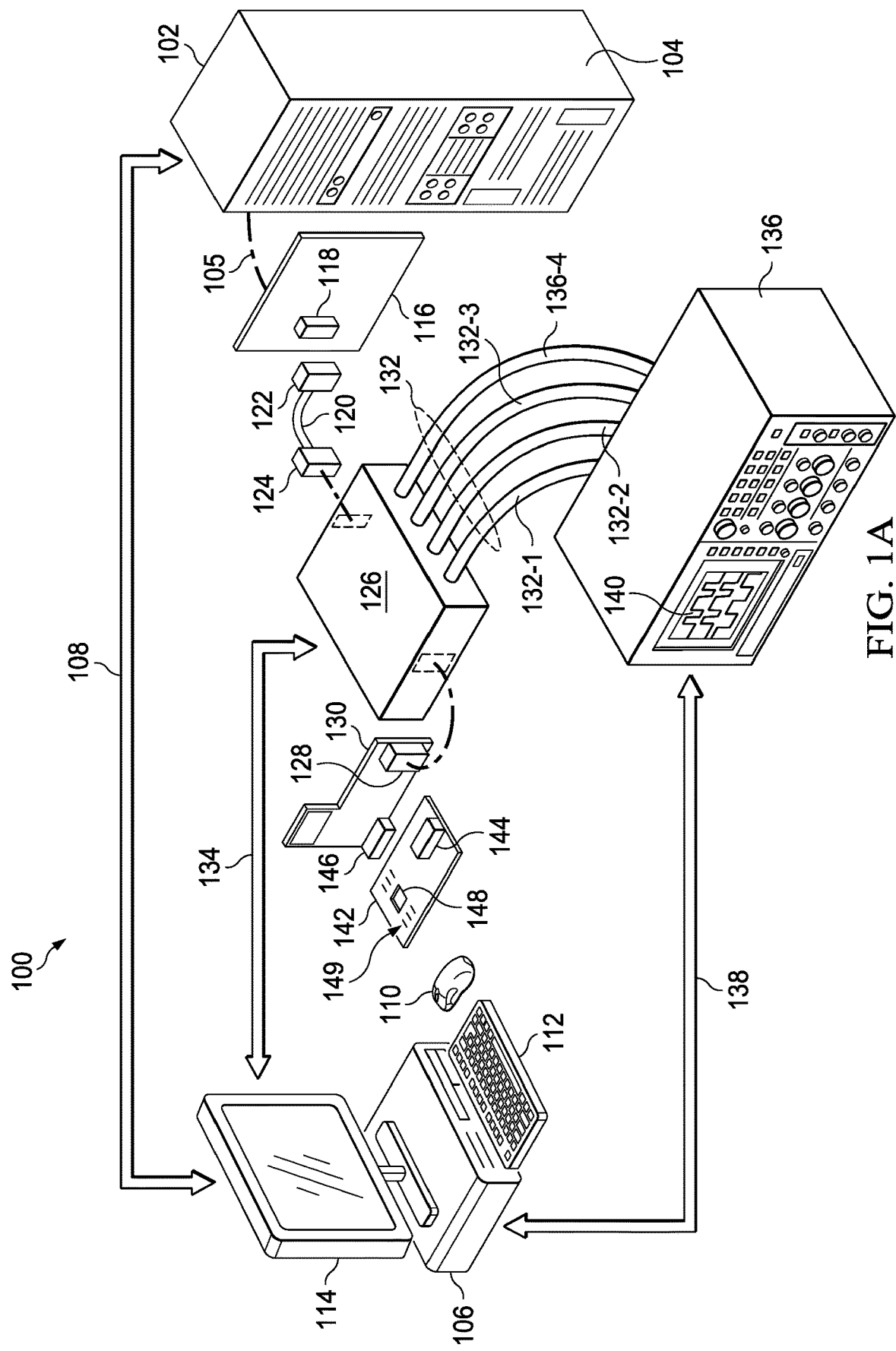
FIG. 1A illustrates an example embodiment of an IC testing system.

FIG. 1A illustrates an example embodiment of an IC testing system 100. Testing system 100 includes a tester 102, which may be one of various commercially-available or developed general-purpose IC testing devices. One contemporary example for tester 102 is an ETS-88 provided by Teradyne Inc., which includes a tester cabinet 104 that houses a test head (not separately shown). Other such testing devices can interface to an external test head via various docking apparatus, such as through one or more cables. Tester 102 generates and outputs test signals, shown generally as test signals 105, for IC testing. The tester 102 test signal 105 production may vary depending on the tester complexity, and in some instances tester 102 may be configurable, based on internal and sometimes interchangeable resources. Such resources are typically referred to by classes and may include, as examples, digital, analog, timing, high-power, and high-precision. Typically, the available test signals 105 can be used to test analog and mixed-signal ICs, but other simple or high precision ICs also may be tested. Tester 102 may be programmable to various extents, but also may interface with an external control device for purposes of beginning, ending, and sequencing the various test signals. Accordingly, for sake of example, system 100 includes a separate test controller 106, typically embodied as a computational device, such as a personal computer, workstation, or the like. As a computational device, test controller 106 includes known hardware (e.g., processor and memory) that is also programmable, and may be programmed with an ATE test sequence. Accordingly, as test controller 106 executes the ATE test sequence, test controller 106 controls tester 102, via a first bus 108, so that tester 102 outputs corresponding IC test signals according to the programmed ATE test sequence. Also as a computational device, test controller 106 may include various forms of input/output (I/O). For example, FIG. 1A illustrates additional test controller 106 I/O devices, including a mouse 110, a keyboard 112, and a display 114. While not illustrated, test controller 106 I/O also may include a network interface, either wired or wireless, for both distant control and data communication.

Testing system 100 also includes a hardware interface board (HIB) 116. HIB 116 facilitates a physical and electrical connection to tester 102. Accordingly, while FIG. 1A shows HIB 116 separated (e.g., in an exploded view illustration) from tester 102, HIB 116 physically and electrically interfaces to the outside, or within a compartment, of tester 102. For sake of illustration, therefore, HIB 116 is shown vertically in FIG. 1A, as it may be mounted in such an orientation against a vertical plane that is part of, or included within, tester 102. Accordingly, signals may be communicated to/from tester 102, through HIB 116, as to other components in system 100, as described below. Also in this regard, HIB 116 includes a signal interface connector 118.

Testing system 100 also includes a cable 120, with an HIB connector 122 at one end and an interposer connector 124 at its other end. HIB connector 122 is for physically and electrically coupling to signal interface connector 118 of HIB 116, whereby signals may be communicated between cable 120 and HIB 116 (and accordingly, between cable 120 and tester 102). Interposer connector 124 is for physically and electrically coupling, by a respective interface shown in phantom, to an interposer 126, further described below, and whereby signals may be communicated between signal conductors of cable 120 and interposer 126.

Figure 1B:
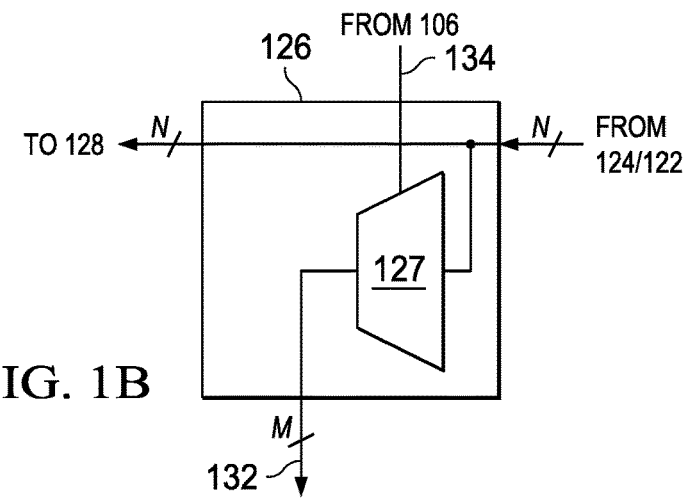
FIG. 1B illustrates an electrical block diagram of the interposer from FIG. 1A.

FIG. 1B further illustrates, along with FIG. 1A, that interposer 126 connects, by a respective interface shown in phantom, to a test board connector 128 of an additional testing board, referred to herein as a loadboard 130. Interposer 126 provides both an electrical and physical intermediary coupling between cable 120 and loadboard 130, and interposer 126 also provides a selectable output signal set 132. As detailed later, test signals from tester 102 may pass by HIB 116 and cable 120 (via its connectors 122 and 124) through interposer 126 to loadboard 130 (and beyond), while interposer 126 also may periodically select a subset of those signals, and provide the selected subset as output signal set 132. Accordingly, to the extent that a signal in output signal set 132 is a same signal at a node on loadboard 130, that same signal can be analyzed via interposer 126, without having to physically contact (e.g., probe) loadboard 130. Further, the interposer 126 signal selection, and subsequent analyses of selected signals, may be by automated control, and without the need for manual movement of a probe, such as in the sense of human-directed probing as described earlier. For example, for signal selectivity, interposer 126 is connected via a second bus 134 to test controller 106, for example with second bus 134 implemented as a Universal Serial Bus (USB) interface on both devices. Accordingly, test controller 106 can issue control signaling along second bus 134 to control which signal(s), at which time(s), interposer 126 selects from its inputs to output as output signal set 132. Interposer 126 may respond to the test controller signaling with selection circuitry, for example, by an N-to-M signal multiplexer 127, where N is the number of interposer input signals from HIB connector 122/tester 102 (e.g., N=280 for the example of tester 102 as an ETS-88), and M being a selected number of output signals for analysis, and that form output set 132. Additionally, bidirectional communication is not inherently needed between test controller 106 and interposer 126. However, interposer 126 may communicate back to tester controller 106, for example with acknowledgement of commands, hand-shaking, and to present errors with the setup.

In the example of FIG. 1A, output set 132 is shown to include M=4 outputs (each shown by a respective conductor). Output set 132 may be connected to additional signal processing apparatus, which in the example of FIG. 1A is shown as an oscilloscope 136. In such a connection, each signal in output set 132 may be provided along a corresponding BNC cable (132_1, 132_2, 132_3, 132_4) to a respective BNC connector (not shown) on oscilloscope 136.

The value M of interposer output signals preferably corresponds to, or is less than, the number of oscilloscope 136 signal analyzing channels, so in the illustrated example of M=4, then oscilloscope 136 has four corresponding input channels. Oscilloscope 136 is also connected, via a third bus 138, to test controller 106. Third bus 138 may be whatever interface is facilitated by oscilloscope 136 and test controller 106, such as USB, RS232, or a General Purpose Interface BUS (GPIB). Accordingly, and as also detailed later, as test controller 106 directs the selection circuitry (e.g., multiplexer 127) of interposer 126 to select signals for output and analysis, test controller 106 also may contemporaneously control settings of oscilloscope 136, so that the selected signals may be monitored by view to a display 140 of oscilloscope 136, or so that data corresponding to those selected signals may be communicated to, and stored and/or analyzed by, test controller 106.

Loadboard 130, introduced above, includes signal paths and circuitry for selecting among the N resource signals provided by tester 102, as those signals are communicated through the intermediate paths of HIB 116, cable 120, and interposer 126. For example, during the duration of an ATE test program sequence, a number of different tester 102 resourced signals may be supplied, while loadboard 130 can include switches, relays, or the like, so that during a portion of that period, only a subset of the resourced signals are provided to a DUT, which is located on a contactor interface board (CIB) 142, detailed below. Lastly, inasmuch as loadboard 130 couples to CIB 142, loadboard 130 also may include and thereby provide electromagnetic shielding of some or all of the signal test points on CIB 142.

Introduced above, testing system 100 also includes CIB 142, which includes a CIB connector 144 for coupling, electrically and mechanically, to a counterpart loadboard connector 146 on loadboard 130. CIB 142 also includes a DUT socket 148, sometimes referred to as a contactor. DUT socket 148 has a set of signal conductors 149 that receives a DUT (not shown), so that each DUT external conductor (e.g., pin or pad) aligns with a respective signal conductor in the set of signal conductors 149 of socket 148. Further, a set of pins are either part of, or proximate, socket 148, where each pin electrically communicates with a conductor of the set of conductors 149 in socket 148 and therefore may be contacted (e.g., probed manually), so as to sense a signal on a corresponding pad of the DUT, when the DUT is located in socket 148. CIB 142 may include other nodes and testing elements, such as vias, pads, relays, and passive devices, for routing signals between or to nodes on the CIB 142 and available for additional probing of the test signals.

Figure 2:
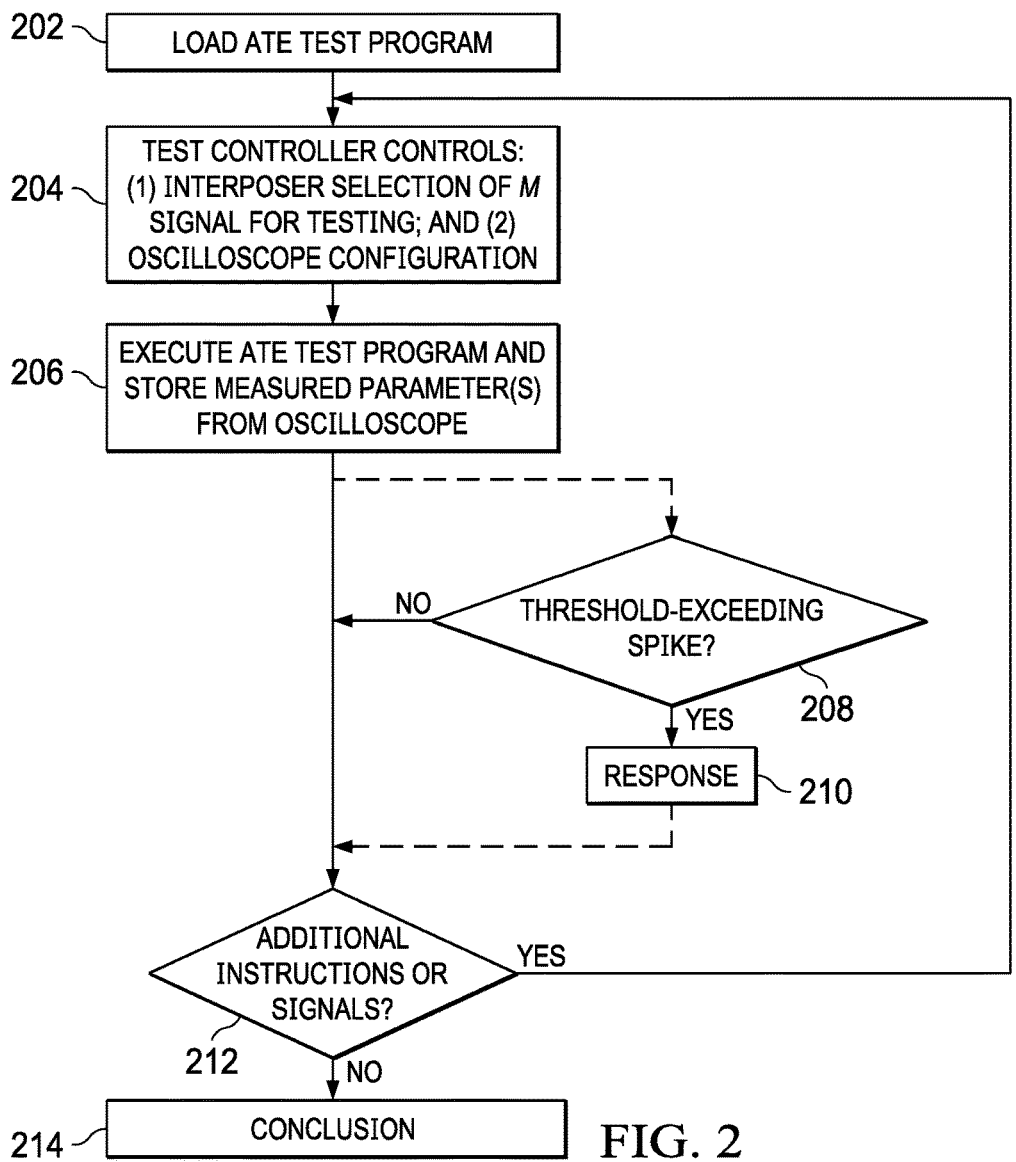
FIG. 2 illustrates a flowchart of an example embodiment method as may be performed by the FIG. 1A system in connection with ATE spike checking of an IC.

FIG. 2 illustrates a flowchart of an example embodiment method 200, as may be performed by programming system 100, in connection with ATE test program spike checking and logging. Method 200 is provided by way of example, where the teachings of this document also facilitate the addition, deletion, or re-ordering of one or more steps in method 200. Further, a flowchart is used by way of example as to step sequencing, but other forms (e.g., state diagram) also may be used to demonstrate the flow, from which adequate programming of system 100 may be provided.

Method 200 starts with a step 202. In step 202, a user causes an ATE test program, appropriate for the applicable IC in socket 148, to be loaded into system 100. Accordingly, example embodiments contemplate that system 100 may store, or have access to, multiple different ATE programs, based on various of the hardware and connectivity in system 100 and the to-be-tested IC. In the illustrated example, the ATE program can be stored in, or accessed by, test controller 106. Alternatively, to the extent that tester 102 is programmable, it too may store or receive part or all of the ATE test program. Step 202 may be achieved by a user cooperating with an appropriate interface (e.g., graphical user interface (GUI)) of test controller 106, either at the location of test controller 106, or given the I/O networking, step 202 may be commenced at a distance remote from system 100. Notably in contrast to the prior art, the step 202 ATE test program load, and subsequent execution of that test program, may commence and continue without a user having manually probed any test point of system 100. Moreover, the user's involvement with the spike checking thereafter can be minimal, and indeed, the user need not be contemporaneously involved with, or at the location of, system 100, for the remainder of the spike checking. In all events, the steps of method 200 all may be achieved though system 100 programming Next, method 200 continues from step 202 to step 204.

In step 204, test controller 106 controls interposer 126 and oscilloscope 136 during either a portion or all of execution of the step 202 loaded ATE test program. Specifically, test controller 106 sends a control signal(s) to interposer 126, indicating a desired set of M signals. In response, interposer 126 (e.g., by multiplexer 127) selects the M signals from the N input signals that interposer 126 receives from tester 102, and the selected M signals are output as signal set 132 to oscilloscope 136. Also, test controller 106 sends a control signal(s) to oscilloscope 136, indicating desired configuration information, which can be any one or more of the trigger, voltage scale, time scale, and measure utilities. In response, oscilloscope 136 configures according to the received configuration information. Next, method 200 continues from step 204 to step 206.

In step 206, the ATE test program (e.g., loaded in step 202) is enabled and responsively starts execution in test controller 106. For some or all of the executed ATE test program instructions, test controller 106, either contemporaneously, or by control signals from its earlier step 204, synchronizes oscilloscope 136 to the M signals from interposer 126. In response, oscilloscope 136 outputs measured parameters, relative to the currently-analyzed M signals, via third bus 138 to test controller 106. The parameters can include any one or more of signal maximum, signal minimum, oscilloscope channel subtraction differences, and screen displays (as generally, oscilloscope 136 can include the capability to store a current output of its display 140 to memory or to output it via USB, such as to third bus 138). In response, test controller 106 can store the measured parameters and method 200 continues to a step 212.

Also as an alternative, or in addition to step 206 storing the oscilloscope measured parameters, an optional step 208 causes test controller 106 to real-time determine if a received oscilloscope parameter is representative of a spike, or whether a spike is beyond a predetermined threshold. If such a condition occurs, test controller 106 responds in step 210, for example by flagging the condition in a test-controller stored report, memory, or the like, or alternatively external action may be taken, such as sending a real-time indication beyond system 100 or halting further execution of the ATE test program. If the step 210 response does not require a halt of the ATE test program, then after step 208 (and possibly step 210), method 200 continues to step 212.

Step 212 determines if there are either additional instructions remaining to be executed for the ATE test program as to the current set of M signals, or whether there are additional signals, in the total N signals input to interposer 126, to be evaluated. If either condition is true, then method 200 returns to step 204. For a return to step 204, if the test program has been fully executed for a current set of M signals, then test controller 106 indicates a new set of M signals for selection by interposer 126 to output as set 132 to oscilloscope 136, and the above-described steps then repeat for the new set. Alternatively, for a return to step 204 if the test program has not been fully executed for a current set of M signals, then test controller 106 will advance to step 206 to continue (or complete) the test program for the current set of M signals.

Eventually, when all desired signals are evaluated through all desired ATE test instructions, then step 212 identifies such completion and method 200 concludes in step 214. At conclusion step 214, test controller 106 has received and optionally stored data, where the data indicates oscilloscope-measured parameters for one or more sets of M signals, with each set representing partial or full execution of an ATE test program. Such data has been achieved without the prior art process of a manual test point probe during execution of the entire ATE test program, and without a test engineer watching an oscilloscope display during that duration. Moreover, in the prior art the test engineer may set the oscilloscope scale in a manner (e.g., too large a scale) where short-duration spikes may go unobserved, whereas the example embodiment provides a data record that can be more closely, or computationally, analyzed, without for example relying on visual observation, so as to detect such events. Moreover, with interposer 126 located between tester 102 and load-board 130 and/or with the addition of the automated nature of certain aspects of the example embodiment, many more signals are anticipated as selected and analyzed, as compared to prior art techniques, such as manual probing on CIB 142. For example, under prior art manual loadboard probing, a test engineer is generally limited to a certain number of signals, either due to accessibility of only certain signals at reachable conductive points, or practically as the total number of signals (e.g., N=280) is impermissibly large to warrant what would be the needed time/human resources to satisfactorily or exhaustively test. Example embodiments, however, address both of these limits, both with interposer 126 favorably positioned for access to all tester 102 signals and with combination of apparatus, connectivity, and automation that permits method 200 to commence and operate with limited or no human interaction. For example, with interposer 126 positioned as shown in FIG. 1A, there is direct signal connection (via HIB 116) to the tester resource signals, which themselves can be selected by interposer 126 in sets of M signals and evaluated by oscilloscope 136, in contrast to the prior art which may not have access to those signals by manual probing on CIB 142 (or a comparable test head). In this manner, loads incurred by tester 102 itself can be evaluated per method 200, for example therefore to ensure that particular spike testing is not potentially damaging to a resource(s) of tester 102.

Example embodiments further contemplate an interposer 126 coupled at any point between the tester and the IC to be tested, so as to select a signal in a path between the tester and the IC to be tested. In system 100, interposer 126 is connected in what is sometimes called to as a soft-dock configuration, referring to a cable connection between CIB 142 and tester 102. In an alternative embodiment, interposer 126 can be implemented in a hard-dock configuration, in which case interposer 126 interfaces electrically and physically in a direct connection, as may be augmented by ways of rigid fasteners (e.g., screws) or the like. Moreover, to the extent that the signal path between tester 102 and the DUT IC includes more or less connections than shown in FIG. 1A, interposer 126 may be positioned at various different locations along that signal path, having a coupling (electrical access, but not necessarily a direct physical connection to) to a signal along the path. In any event, interposer 126 in any of these positions provides a separate interface to an oscilloscope or other signal diagnostic apparatus, for monitoring up to M signals, of the tester N signals, at a given time.

From the above, one skilled in the art should appreciate that example embodiments include a post-silicon IC spike testing system and methods for improving such testing. Example embodiments have been described with various options and alternatives, as well as various benefits. For example, preferred embodiments may automate, either partially or fully, the selection, storage, and analysis of IC testing signals, while adding uniformity in testing and reducing or removing the need for manual and human interaction. Additionally, test signals can include both signals at the IC pins as well as signals from the tester's resources, the latter of which may not be typically accessible due to intervening signal devices and/or processing. Further, example embodiments may significantly reduce time and error associated with prior art spike testing. These and other examples will be appreciated or ascertainable by one skilled in the art, in view of the teachings of this document. Accordingly, additional modifications are possible in the described embodiments, and other embodiments are possible, within the scope of the following claims.

What is claimed is:

1. Apparatus for testing an integrated circuit, comprising:
a set of signal conductors for communicating signals to respective external conductors of the integrated circuit;
a tester comprising circuitry for outputting a test signal;
an interposer electrically coupled between the set of signal conductors and the tester, the interposer comprising selection circuitry configured to select a set of signals between the set of signal conductors and the tester in response to receiving a selection signal, and configured to output the set of signals; and
signal processing apparatus coupled to receive the set of signals, the signal processing apparatus operable to evaluate a parameter associated with each signal in the set of signals.

2. The apparatus of claim 1 wherein the parameter comprises one of a signal maximum, a signal minimum, and a signal differential.

3. The apparatus of claim 1 wherein the signal processing apparatus comprises an oscilloscope.

4. The apparatus of claim 1 and further comprising a controller coupled to the tester, the interposer, and the signal processing apparatus.

5. The apparatus of claim 4 wherein the controller is configured to couple the selection signal to the interposer for directing the interposer to select the set of signals of an integer number M from a larger integer number N of input signals.

6. The apparatus of claim 5 wherein the tester is for providing the larger integer number N of input signals as tester test signals.

7. The apparatus of claim 5 wherein the controller is configured to execute a test program sequence and to control the tester to output at least one test signal in response to executing test program sequence.

8. The apparatus of claim 7 wherein the at least one test signal comprises one of the N input signals.

9. The apparatus of claim 7 wherein the controller is configured to control the signal processing apparatus for a setting comprising at least one of trigger level, voltage scale, or time scale.

10. The apparatus of claim 1 and further comprising a board comprising the set of signal conductors in a socket for receiving the integrated circuit.

11. The apparatus of claim 1 wherein the parameter comprises a digital image responsive to one or more signals in the set of signals.

12. The apparatus of claim 1 and further comprising an interfacing board coupled between the tester and the interposer.

13. The apparatus of claim 12 and further comprising a cable coupling the interfacing board and the interposer.

14. The apparatus of claim 1 wherein the signal processing apparatus comprises an oscilloscope and a computational device in communication with the oscilloscope.

15. The apparatus of claim 1 wherein the selection circuitry comprises an N-to-M signal multiplexer.

16. Apparatus for testing an integrated circuit, comprising:
   a set of signal conductors for communicating signals to respective external conductors of the integrated circuit;
   a tester comprising circuitry for outputting a test signal;
   an interposer electrically coupled between the set of signal conductors and the tester, the interposer comprising circuitry for selecting a set of signals between the set of signal conductors and the tester and outputting the set of signals; and
   an oscilloscope coupled to receive the set of signals, the oscilloscope operable to evaluate a parameter associated with each signal in the set of signals, wherein the oscilloscope comprises an integer number M of channels, and wherein the set of signals consists of M or less signals.

17. A method of correcting a test program test sequence for an integrated circuit, comprising:
   executing a test program test sequence test to output test signals in response to instructions in the test program test sequence;
   coupling the test signals to an interposer and to a set of conductors coupled to an integrated circuit;
   for each time period in a number of time periods, transmitting a selection signal to the interposer to direct the interposer to select a respective subset of the test signals for the time period in response to receiving the selection signal; and
   coupling the subset of the test signals to a signal processing apparatus operable to evaluate a parameter associated with each signal in the subset.

18. The method of claim 17 and further comprising operating the signal processing apparatus to identify whether the parameter exceeds a limit.

19. The method of claim 18 and further comprising, in response to identifying that the parameter exceeds the limit, identifying an instruction in the test program test sequence corresponding to the parameter exceeding the limit.

20. The method of claim 19 and further comprising revising the identified instruction and re-executing the revised instruction to identify whether a signal parameter associated with the revised instruction exceeds the limit.

21. The method of claim 17 wherein the interposer comprises selection circuitry configured to select the respective subset of the test signals in response to receiving the selection signal.

22. The method of claim 21 wherein the selection circuitry comprises an N-to-M signal multiplexer.

23. The method of claim 17 wherein the signal processing apparatus comprises an oscilloscope including an integer number M of channels, and wherein the subset of test signals consists of M or less signals.

* * * * *